United States Patent
Abbasi et al.

(10) Patent No.: US 12,191,815 B2
(45) Date of Patent: Jan. 7, 2025

(54) SUB-MICRON CMOS HIGH-POWER CASCODE RF POWER AMPLIFIER

(71) Applicant: Renesas Electronics America Inc., Milpitas, CA (US)

(72) Inventors: Morteza Abbasi, Vista, CA (US); Tumay Kanar, Carlsbad, CA (US); Naveen Krishna Yanduru, San Diego, CA (US)

(73) Assignee: Renesas Electronics America Inc., Milpitas, CA (US)

( * ) Notice: Subject to any disclaimer, the term of this patent is extended or adjusted under 35 U.S.C. 154(b) by 779 days.

(21) Appl. No.: 17/406,388

(22) Filed: Aug. 19, 2021

(65) Prior Publication Data

US 2022/0085767 A1    Mar. 17, 2022

Related U.S. Application Data

(60) Provisional application No. 63/076,980, filed on Sep. 11, 2020.

(51) Int. Cl.

| | |
|---|---|
| *H03F 1/22* | (2006.01) |
| *H01Q 3/36* | (2006.01) |
| *H03F 1/02* | (2006.01) |
| *H03F 3/195* | (2006.01) |
| *H03F 3/24* | (2006.01) |
| *H03F 3/45* | (2006.01) |

(52) U.S. Cl.
CPC .............. *H03F 1/223* (2013.01); *H01Q 3/36* (2013.01); *H03F 1/0211* (2013.01); *H03F 3/195* (2013.01); *H03F 3/245* (2013.01); *H03F 3/45179* (2013.01); *H03F 2200/451* (2013.01)

(58) Field of Classification Search
CPC ........ H03F 1/223; H03F 1/0211; H03F 3/195; H03F 3/245; H03F 3/45179; H03F 2200/451; H03F 3/45475; H03F 3/68; H03F 3/193; H03F 3/21; H01Q 3/36
USPC ........................................................ 330/311
See application file for complete search history.

(56) References Cited

U.S. PATENT DOCUMENTS

| | | | |
|---|---|---|---|
| 7,573,332 B1 * | 8/2009 | Kase | H03F 3/45183 330/253 |
| 8,143,950 B2 * | 3/2012 | Hwang | H03F 1/223 330/311 |
| 9,935,584 B1 * | 4/2018 | Turner | H03F 1/56 |
| 2015/0348945 A1 * | 12/2015 | Or-Bach | H10B 43/20 257/384 |
| 2020/0169004 A1 * | 5/2020 | Zihir | H01Q 1/26 |

* cited by examiner

*Primary Examiner* — Andrea Lindgren Baltzell
*Assistant Examiner* — Jose E Pinero
(74) *Attorney, Agent, or Firm* — SCULLY, SCOTT, MURPHY & PRESSER, P.C.

(57) ABSTRACT

An apparatus includes an amplifier circuit including a first transistor and a second transistor. The first transistor may include a gate having a gate oxide with a first thickness and a first gate length. The second transistor may include a gate having a gate oxide with a second thickness and a second gate length. The first transistor and the second transistor may be connected in a cascode configuration and the second thickness and the second gate length are greater than the first thickness and the first gate length, respectively.

17 Claims, 11 Drawing Sheets

SUB-MICRON CMOS HIGH-POWER CASCODE RF POWER AMPLIFIER

CROSS-REFERENCE TO RELATED APPLICATION

This application claims the benefit of U.S. Provisional Application No. 63/076,980 filed on Sep. 11, 2020. The entire content of U.S. Provisional Application No. 63/076,980 is incorporated herein by reference.

BACKGROUND

The present disclosure relates in general to power amplifiers and, more particularly, to a method and/or apparatus for implementing a sub-micron complementary metal oxide semiconductor (CMOS) high-power cascode radio frequency (RF) power amplifier.

There is increasing interest in designing RF power amplifiers to provide high-power, linear, and efficient power amplification in integrated transceiver chips using sub-micron CMOS technology in wireless communication applications. An issue in the design of power amplifiers in sub-micron CMOS is oxide breakdown. The oxide breakdown is a catastrophic effect and sets a limit on the maximum signal voltage swing. A severe consequence of the voltage limitation is a need for increased drive current to achieve high output power. The drive current is determined by the total gate width of the device given an optimum current density. However, another issue in the design of power amplifiers in sub-micron CMOS is a limit on unit gate width. Increasing the unit gate width comes with excess gate resistance, and increasing the number of gate fingers comes with excess phase difference between gates, both of which reduce the power gain of the device.

It would be desirable to implement a sub-micron CMOS high-power cascode RF power amplifier to benefit from short gate length CMOS technology while consuming the large voltage swing across a longer channel with thicker oxide. It would also be desirable to be able to increase the width of the unit gate finger without increasing the gate resistance.

SUMMARY

In some examples, an apparatus for power amplification is generally described. The apparatus may include a first transistor having a gate having a gate oxide with a first thickness and a first gate length. The first transistor may be configured as a common source amplifier stage. The apparatus may further include a second transistor having a gate having a gate oxide with a second thickness and a second gate length. The second transistor may be configured as a common gate amplifier stage. The first transistor and the second transistor may be connected in a cascode configuration. The second thickness may be greater than the first thickness and the second gate length may be greater than the first gate length.

In some examples, an apparatus for power amplification is generally described. The apparatus may include a first bias circuit configured to output a first bias voltage. The apparatus may further include a second bias circuit configured to output a second bias voltage. The apparatus may further include a first amplifier circuit and a second amplifier circuit. Each one of the first and second amplifier circuits may include a first transistor comprising a gate having a gate oxide with a first thickness and a first gate length. The first transistor may be configured as a common source amplifier stage. Each one of the first and second amplifier circuits may further include a second transistor comprising a gate having a gate oxide with a second thickness and a second gate length the second transistor being configured as a common gate amplifier stage. The first transistor and the second transistor may be connected in a cascode configuration. The second thickness may be greater than the first thickness and the second gate length may be greater than the first gate length. Each one of the first amplifier circuit and the second amplifier circuit may be configured to receive an input signal biased by the first bias voltage, receive the second bias voltage to drive a gate of the second transistor, and output an output signal that is an amplified version of the input signal.

In some examples, an apparatus for power amplification is generally described. The apparatus may include a phased antenna array and a communication circuit connected to the phased antenna array. A power amplifier stage of the communication circuit may include a first bias circuit configured to output a first bias voltage. The power amplifier stage may further include a second bias circuit configured to output a second bias voltage. The power amplifier stage may further include a first amplifier circuit and a second amplifier circuit. Each one of the first and second amplifier circuits may include a first transistor comprising a gate having a gate oxide with a first thickness and a first gate length. The first transistor may be configured as a common source amplifier stage. Each one of the first and second amplifier circuits may include a second transistor comprising a gate having a gate oxide with a second thickness and a second gate length. The second transistor may be configured as a common gate amplifier stage. The first transistor and the second transistor may be connected in a cascode configuration. The second thickness may be greater than the first thickness and the second gate length may be greater than the first gate length. Each one of the first amplifier circuit and the second amplifier circuit may be configured to receive an input signal biased by the first bias voltage, receive the second bias voltage to drive a gate of the second transistor, and output an output signal to the phased antenna array. The output signal may be an amplified version of the input signal.

Further features as well as the structure and operation of various embodiments are described in detail below with reference to the accompanying drawings. In the drawings, like reference numbers indicate identical or functionally similar elements.

DETAILED DESCRIPTION

The present disclosure concerns an apparatus including an amplifier circuit comprising a first transistor and a second transistor. The first transistor generally comprises a gate having a gate oxide with a first thickness and a first gate length. The second transistor generally comprises a gate having a gate oxide with a second thickness and a second gate length. The first transistor and the second transistor are connected in a cascode configuration and the second thickness and the second gate length are greater than the first thickness and the first gate length, respectively.

Embodiments described herein may provide methods and techniques for implementing a sub-micron complementary metal oxide semiconductor (CMOS) high-power cascode radio frequency (RF) power amplifier that may (i) overcome the voltage swing limitations in sub-micron CMOS technology, (ii) overcome the maximum unit gate width in sub-micron CMOS technology, (iii) combine the high gain of a thin-oxide device with the large voltage swing of a thick-oxide device, (iv) compensate for distortions (e.g., AM-AM, AM-PM distortions) of the thin-oxide device with the thick-oxide device to improve overall linearity of the amplifier, (v) be well suited for silicon-on-insulator (SOI) technology with body contact, (vi) avoid excess voltage applied across the drain to body junction, and/or (vii) be implemented as one or more integrated circuits.

Figure 1:
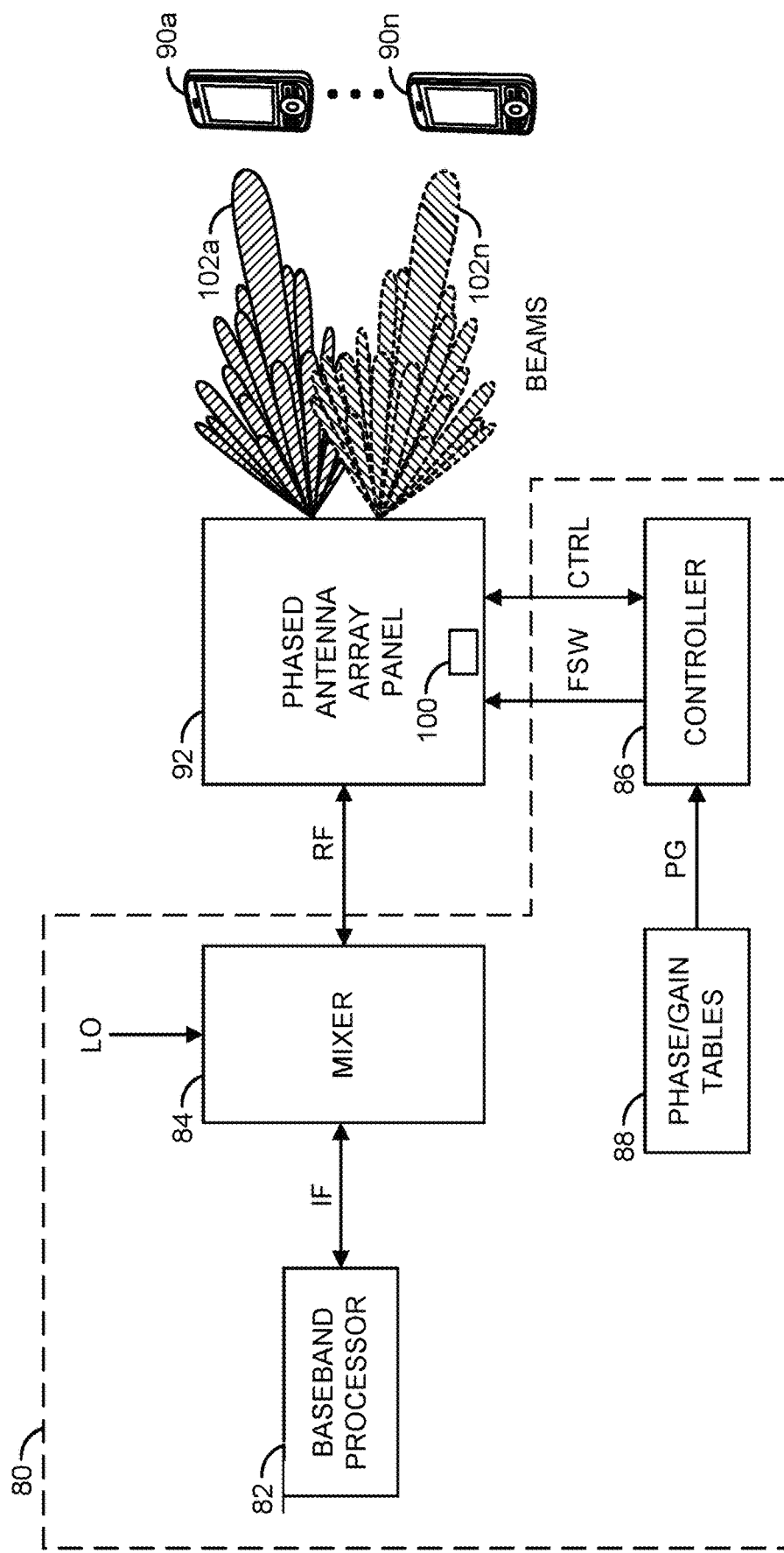
FIG. 1 is a diagram illustrating an example context of the invention.

Referring to FIG. 1, a block diagram of a system 80 is shown. The system (or module or circuit or apparatus) 80 may implement a radio-frequency (RF) transceiver system in accordance with an example embodiment. The RF transceiver system 80 may be configured to operate at common wireless radio frequencies, millimeter-wave frequencies, and/or microwave frequencies. In an example, the RF transceiver system 80 facilitates communication with and/or between a plurality of communications devices (or terminals) 90a-90n. In an example, the communications devices 90a-90n may include, but are not limited to, cellular telephones, mobile devices, tablets, internet-of-things (IoT) equipment, etc. In various embodiments, the RF transceiver system 80 and the communications devices 90a-90n may be coupled using at least one phased array antenna panel 92. The phased array antenna panel 92 may include a number of antenna elements and a number of beam former circuits (or chips), which are described below in connection with FIGS. 2-5. The beam former circuits may comprise power amplifiers 100 in accordance with an example embodiment.

In an example, the RF transceiver system 80 may form part of a communications link. In some embodiments, the communications link may be part of a fifth generation (5G) wireless communications system (e.g., for which a standard is currently under development by the Next Generation Mobile Networks (NGMN) Alliance). In other embodiments, the communications link may be part of systems including, but not limited to, a fourth generation (4G) wireless communications system (e.g., International Mobile Telecommunications-Advanced (IMT-A) standard published by the International Telecommunications Unit Radiocommunication Sector (ITU-R)), a satellite communication (SATCOM) system, and point-to-point communications systems such as common data link (CDL). However, other communications standards may be implemented to meet the design criteria of a particular application.

In an example, the RF transceiver system 80 may comprise a block (or circuit) 82, a block (or circuit) 84, a block (or circuit) 86, and a block (or circuit) 88. In various embodiments, the blocks 82-88 may be implemented with hardware and/or a combination of hardware and software. A signal (e.g., IF) may be exchanged between the circuit 82 and the circuit 84. The signal IF may implement an intermediate-frequency signal. In an example, the signal IF may be configured (e.g., using various modulation schemes) to carry information to be transmitted from and/or received by the RF transceiver system 80. In an example, a signal (e.g., LO) may be presented to the circuit 84. The signal LO may implement a local oscillator signal. A signal (e.g., RF) may be exchanged between the circuit 84 and the phased array antenna panel 92. The signal RF may be millimeter-wave frequency, or microwave and the phased array may be a radio-frequency signal that conveys the information also found in the intermediate-frequency signal IF.

In a transmit mode, the radio-frequency signal RF may convey information to be broadcast from the phased array antenna panel 92 to the devices 90a-90n. In a receive mode, the radio-frequency signal RF may convey information received from the devices 90a-90n via the phased array antenna panel 92. A signal (e.g., FSW) and a signal or signals (e.g., CTRL) may be exchanged between the circuit 86 and the phased array antenna panel 92. The signal FSW may switch the phased array antenna panel 92 between the transmit mode and the receive mode. The signal(s) CTRL may convey data, clocking, and control elements. In an example, the signals FSW and CTRL may be part of a digital interface of the phased array antenna panel 92. In an example, the signal(s) CTRL may be implemented as a serial link that conveys information for configuring and/or determining phase and/or gain settings for antenna elements of the phased array antenna panel 92. In an example, the signal(s) CTRL may be compliant with one or more serial communication protocols or interfaces (e.g., serial peripheral interface (SPI), inter-integrated circuit communications (I2C), daisy chain, etc.). A signal or signals (e.g., PG) may be transferred from the circuit 88 to the circuit 86. In an example, the signal(s) PG may convey phase information and gain information used by the circuit 86 to implement (control) beam steering using the phased array antenna panel 92. In an example, the signal(s) PG may convey a plurality of phase and gain values that may be programmed into a plurality of beam former circuits of the phased array antenna panel 92 via the signal(s) CTRL.

The phased array antenna panel 92 generally implements a hard-wired address scheme. The hard-wired address scheme may be used to uniquely identify serial communications intended for elements (e.g., the beam former circuits) of the phased array antenna panel 92. In various embodiments, multiple phased array antenna panels 92 may be combined to form a larger antenna array that may provide more transmission channels. The multiple phased array antenna panels 92 may share a serial communication channel, link, or bus. Each of the phased array antenna panels 92 making up the larger antenna array may be uniquely addressed using respective hard-wired addresses.

The phased array antenna panel 92 may generate one or more fields (or beams) 102a-102n. The fields 102a-102n may represent a field pattern (or radio-frequency beam pattern) created by the beam former circuits of the phased array antenna panel 92 based upon the phase and gain information (values) received via the signal(s) CTRL. The phased array antenna panel 92 may be configured to produce directional beams 102a-102n for communication with the communication devices 90a-90n. In an example, the beam former circuits of the phased array antenna panel 92 may be controlled to steer the beams 102a-102n, based on the phase and gain information received via the signal(s) CTRL, to track movement of the communication devices 90a-90n and/or switch between the communication devices 90a-90n.

The circuit 82 may implement a baseband processor circuit. The circuit 82 may be operational to process the information sent by and/or received in the intermediate-frequency signal IF. The circuit 82 may process the information within the RF transceiver system 80. The processing may include, but is not limited to, modulation/demodulation of the signal that contains the information and management of simultaneous communications between the RF transceiver system 80 and the multiple remote terminals 90a-90n.

The circuit 84 may implement one or more mixer circuits. The circuit 84 is generally operational to frequency convert (e.g., up-convert, down-convert, etc.) between an intermediate frequency used for the signal IF and the radio frequency, millimeter-wave frequency, or microwave frequency used for the signal RF. The frequency conversion may be based on one or more local oscillator frequencies provided by the signal LO. In various embodiments, the radio-frequency signal RF may be in a range of frequencies approximately centered around a center frequency of either 28 gigahertz (GHz) or 39 GHz (e.g., 24 GHz to 30 GHz or 37 GHz to 44 GHz). In embodiments implementing multiple intermediate frequencies, each intermediate frequency may cover a band from approximately 2 GHz to about 6 GHz (e.g., an approximately 4 GHz bandwidth). In an example, each local oscillator frequency may range from approximately 22 GHz to 26 GHz when the signal RF is approximately centered at 28 GHz. In another example, each local oscillator frequency may range from approximately 33 GHz to 37 GHz when the signal RF is approximately centered at 39 GHz. However, other frequency ranges may be implemented to meet the design criteria of a particular application.

The circuit 86 may implement a control circuit. In various embodiments, the circuit 86 may be implemented using one or more of an application specific integrated circuit (ASIC), controller, microprocessor, or circuitry configured accordingly. The circuit 86 is generally operational to control the operations of the phased array antenna panel 92. In some embodiments, the circuit 86 may determine the setting values used in each transceiver channel within the beam former circuits of the phased array antenna panel 92. The setting values may establish the geometry of the field(s) or beam(s) 102a-102n. In various embodiments, the circuit 86 may be implemented as one or more integrated circuits.

In an example, the circuit 88 may implement a table of values (e.g., embodied in a memory circuit). In an example, the table of values embodied in the circuit 88 may be configured to store multiple gain (G) values and multiple phase (P) values. The phase and gain values may be used by the transceiver channels in the beam former circuits of the phased array antenna panel 92 to establish the fields 102a-102b. The phase values and the gain values may be fetched from the circuit 88 via the signal PG and programmed into buffers associated with the beam former circuits of the phased array antenna panel 92 by the circuit 86. In various embodiments, the circuits 86 and 88 may be implemented either on the same integrated circuit or on different (separate) integrated circuits.

In an example, the phased array antenna panel 92 may be implemented comprising either single-polarization (or single-pole) antenna elements or dual-polarization (or dual-pole or di-pole) antenna elements. The phased array antenna panel 92 may be operational to transmit and receive wireless signals to and from the devices (or terminals) 90a-90n. The devices (or terminals) 90a-90n may be remotely located from the RF transceiver system 80. Sensitivity to the wireless signals may be determined by the fields 102a-102n created by the phased array antenna panel 92. The phased array antenna panel 92 may comprise a plurality of antenna elements and a plurality of beam former circuits. Each beam former circuit may implement a plurality of transceiver channels. Each transceiver channel generally comprises a transmit channel (or chain) and a receive channel (or chain). Each of the transmit channels generally includes a power amplifier circuit utilizing a sub-micron CMOS cascode power amplifier in accordance with an embodiment of the invention. The transceiver channels may be coupled to the antenna elements by respective matching networks and transmit-receive (TRX) switches in order to exchange corresponding bidirectional radio-frequency signals. The transceiver channels and antenna elements generally form a two-dimensional antenna network.

Figure 2:
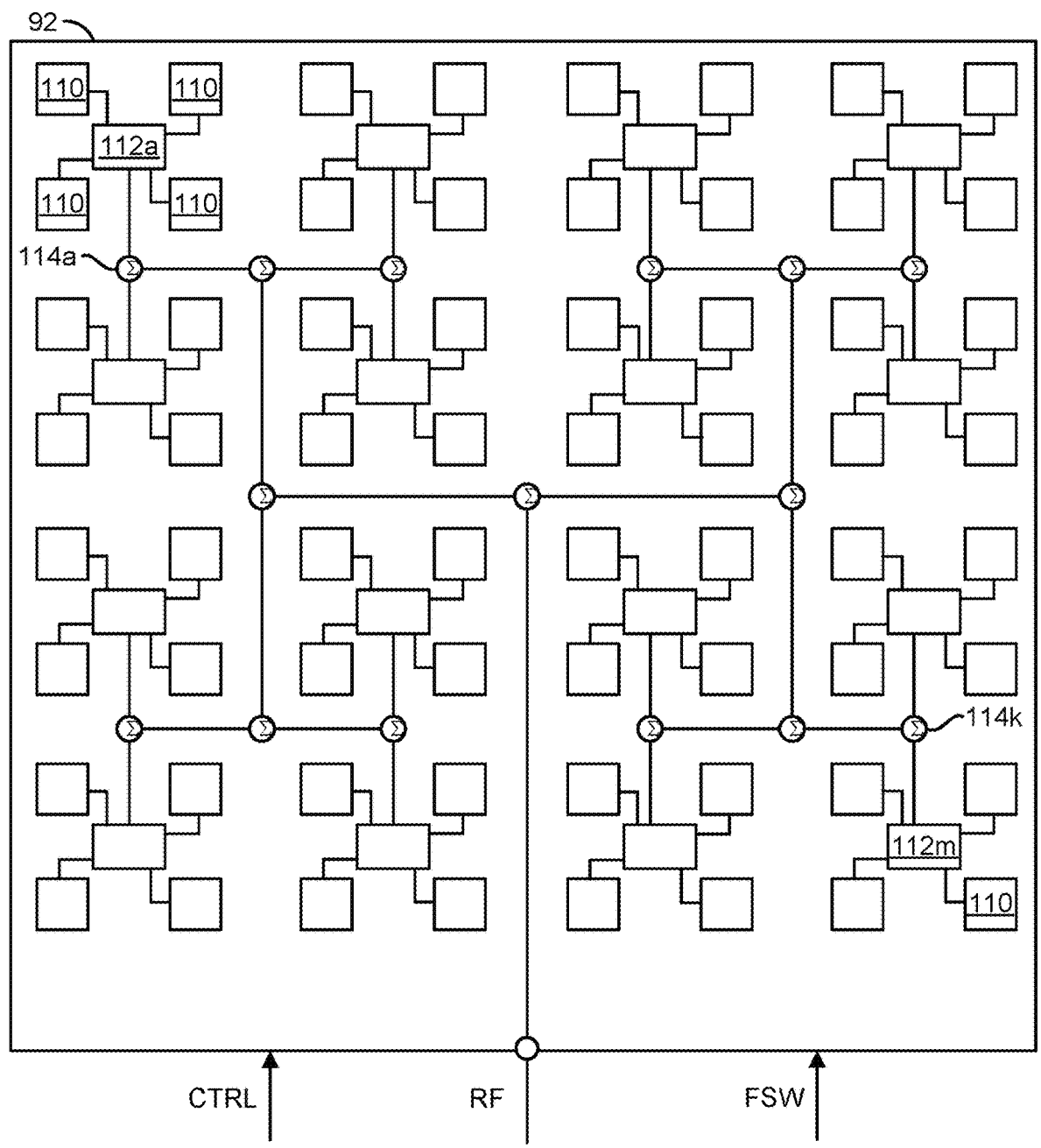
FIG. 2 is a diagram illustrating an example implementation of a single-polarization phased array antenna panel in accordance with an example embodiment of the invention.

Referring to FIG. 2, a diagram is shown illustrating an example implementation of a single-polarization version of the phased array antenna panel 92 in accordance with an embodiment of the invention. In an example, the phased array antenna panel 92 may comprise a number of antenna elements 110, a number of beam former circuits 112a-112m, and a number of blocks (or circuits) 114a-114k. In embodiments implementing a single-polarization phased array antenna panel, the antenna elements 110 generally are implemented as single polarization (or single-pole) antenna elements. Each of the circuits 112a-112m may implement a single-polarization beam former circuit. Each of the circuits 114a-114k may implement a combiner/splitter circuit. The circuits 112a-112m, and 114a-114k may be implemented with hardware, a combination of hardware and software, and/or simulated with software. In an example, the signal RF may be exchanged with one of the circuits 114a-114k. The signals FSW and CTRL may be exchanged with the circuits 112a-112m.

The antenna elements 110 in the phased array antenna panel 92 may be used for both transmission and reception. A physical positioning of the antenna elements 110 generally provides for two-dimensional (e.g., horizontal and vertical) control of the fields 102a-102n. In an example, the antenna elements 110 may be arranged in a 2-dimensional (e.g., N×N) grid pattern, where N is an integer value divisible by two. However, other dimensions of grid patterns may be implemented accordingly to meet design criteria of a particular implementation.

The circuits 112a-112m are generally operational to multiplex/demultiplex the signal RF with a number of the antenna elements 110. In various embodiments, each of the circuits 112a-112m may be mounted on a substrate of the phased array antenna panel 92 adjacent to (e.g., centered among) a number (or group) of the antenna elements 110. In an example, each circuit 112a-112m generally comprises a number of transceiver channels that are coupled to respective antenna elements 110. In an example, each circuit 112a-112m may be coupled to four adjacent antenna elements 110 (e.g., arranged in a 2×2 grid around each circuit 112a-112m). However, other numbers (e.g., 1, 2, 4, 18, etc.) of adjacent antenna elements 110 may be implemented to meet design criteria of a particular implementation.

The circuits 112a-112m may be configured to switch between a transmit mode and a receive mode in response to the signal FSW. In the transmit mode, the circuits 112a-112m may be operational to rapidly change setting values (e.g., phase values, gain values, etc.) used by the transceiver channels in order to steer the beams (or fields) 102a-102n and/or 104a-104n formed by the phased array antenna panel 92. In various embodiments, each of the circuits 112a-112m may comprise a memory, register store, and/or lookup table (LUT) that may be utilized to store a plurality of phase and gain values for each channel of the circuits 112a-112m corresponding to a plurality of beams in a predetermined beam space. In an example, the plurality of phase and gain values for each channel may be associated with an index corresponding to each beam of the beam space. In various embodiments, each of the circuits 112a-112m may be implemented as one or more integrated circuits (e.g., in a package or multi-chip module (MCM)).

In various embodiments, each of the circuits 114a-114k may be implemented as a combiner/splitter circuit. In an example, the circuits 114a-114k may be implemented as Wilkinson combiner/splitters. In various embodiments, the circuits 114a-114k may be coupled together to form a network that couples the circuits 112a-112m to an input/output of the phased array antenna panel 92 configured to present/receive the signal RF. In the transmit mode, the circuits 114a-114k are generally operational to distribute the power in the signal RF among the circuits 112a-112m. In the receive mode, the circuits 114a-114k may be operational to combine the power received in signals from the circuits 112a-112m into the signal RF. The circuits 112a-112n and 114a-114k are generally configured to provide a substantially equivalent path length between the RF input/output of the phased array antenna panel 92 and each of the circuits 112a-112m.

Figure 3:
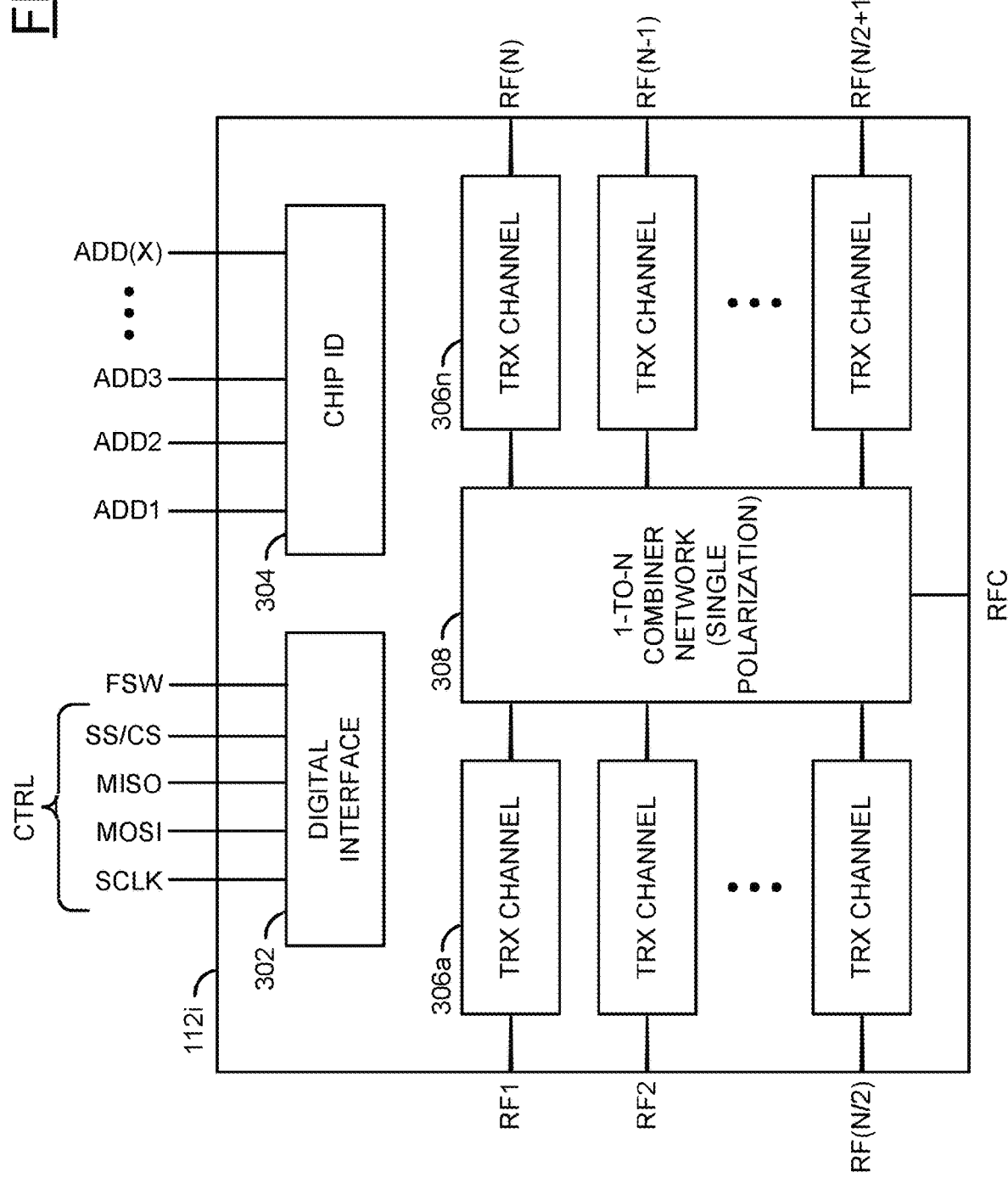
FIG. 3 is a diagram of a single-polarization beam former circuit in accordance with an example embodiment of the invention.

Referring to FIG. 3, a diagram is shown illustrating an example implementation of a single-polarization beam former circuit 112i in accordance with an example embodiment of the invention. In an example, the single-polarization beam former circuit 112i may be representative of the single-polarization beam former circuits 112a-112m of FIG. 2. In an example, the single-polarization beam former circuit 112i may have a digital interface configured to receive the signal FSW and the signal(s) CTRL, a common RF input/output port (RFC), and a number of antenna input/output ports (RF1-RFN). In general, any number (e.g., N) of antenna input/output ports (or channels) may be implemented accordingly to meet design criteria of a particular implementation. In various embodiments, the signal RF presented/received by the common RF input/output RFC, may be and the antenna input/output ports RF1-RFN may be coupled to respective antenna elements 110. The single-polarization beam former circuit 112i generally implements a number of transceiver channels corresponding to the number of antenna input/output ports RF1-RFN. In various embodiments, each of the transceiver channels may comprise a respective transmit channel and a respective receive channel. The transceiver channels are generally configured to switch between transmitting or receiving based upon the signal FSW.

The single-polarization beam former circuit 112i generally implements a transmit mode and a receive mode. In an example, a state of the signal FSW may determine whether the transmit mode or the receive mode is active. In the transmit mode, the single-polarization beam former circuit 112i is generally configured to receive the radio frequency signal RF at the common input/output port RFC and present radio frequency signals at the antenna input/output ports RF1-RFN. The signals presented at each of the antenna input/output ports RF1-RFN are generated by the single-polarization beam former circuit 112i in response to the radio frequency signal RF received at the common input/output port RFC and a respective number of setting values (e.g., gain, phase, etc.) for each transceiver channel corresponding to each of the antenna input/output ports RF1-RFN. In the receive mode, the single-polarization beam former circuit 112i is generally configured to combine radio frequency signals received at the antenna input/output ports RF1-RFN for presentation as the signal RF at the common input/output port RFC.

The single-polarization beam former circuit 112i may comprise a block (or circuit) 302, a block (or circuit) 304, a number of blocks (or circuits) 306a-306n, and a block (or circuit) 308. The circuit 302 may implement an interface circuit. In various embodiments, the circuit 302 may implement a digital interface. The circuit 304 may implement a hard-wired address (e.g., chip ID) for the beam former circuit 112i. The circuits 306a-306n may implement transceiver (TRX) channels. The circuit 308 may implement a 1-to-N combiner/splitter network. In an example, the signals FSW and CTRL are exchanged with the circuit 302. In an example, the circuit 302 may comprise a serial interface. The circuit 302 may be configured to be compliant with one or more serial interface standards including, but not limited to, serial peripheral interface (SPI), inter-integrated circuit (I2C), daisy chain, etc. In an example, the circuit 302 may be configured to allow programming and control of the single-polarization beam former circuit 112i using a serial communication link (or bus). In an example, the circuit 302 may be configured to program and control the circuits 306a-306n in response to the signals CTRL and FSW. In an example, the circuit 302 may control whether the circuits 306a-306n operate in a transmit mode or a receive mode in response to the signal FSW.

In an example, the circuit 302 may implement a 4-wire embedded SPI core. In an example, the circuit 302 may have a first pin that may receive a first signal (e.g., MOSI), a second pin that may present a second signal (e.g., MISO), a clock input pin that may receive a clock signal (e.g., SCLK), and a chip enable (or chip select) pin that may receive a signal (e.g., SS/CS). In an example, the signals MOSI, MISO, SCLK, and SS/CS may be components of the signal(s) CTRL. In an example, the circuit 302 may include a transmit/receive function switching pin that may receive the signal FSW. In an example, the signals MOSI, MISO, SCLK, and SS/CS may be configured to implement a 4-wire SPI protocol interface as summarized in the following TABLE 1:

TABLE 1

| SIGNAL | FUNCTION |
| --- | --- |
| MOSI | Master out Slave in |
| MISO | Master in Slave out |
| SCLK | Serial clock |
| SS/CS | Slave Select/Chip Select |

In an example, the circuit 304 may set a physical address of the beam former circuit 112i based upon hardware coded address bits (or pins). In various embodiments, a hard-wired address may be implemented having a number (e.g., X) of input bits (e.g., ADD1, ADD2, . . . , ADD(X)). In an example, the address may be implemented having six bits (or pins). In some embodiments, the hard-wired address may be set to predetermined logic levels (e.g., 0 or 1) by tying a number of address pins to predetermined supply voltages (e.g., GND, vss, or VDD). In some embodiments, the hard-wired address bits may be hard coded within the chip implementing the beam former 112i. In some embodiments, the hard-wired address bits may be programmable within the chip implementing the beam former 112i during manufacturing. In an example, the hard-wired address bits may be programmed using fuses, anti-fuses, or other conventional techniques.

Figure 4:
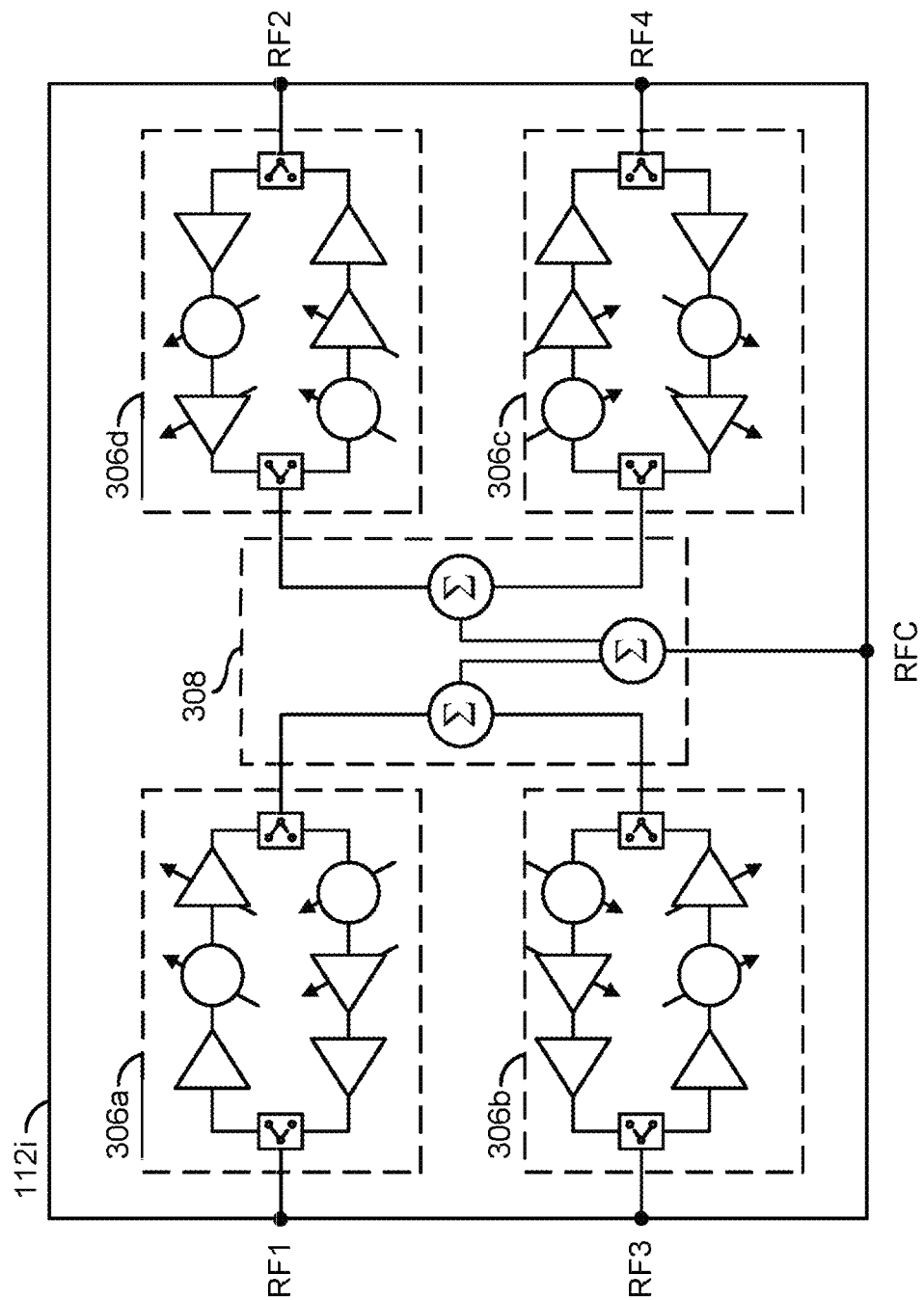
FIG. 4 is a diagram illustrating an example implementation of a generic 2×2 four-element single-polarization transceiver beam former circuit in accordance with an example embodiment of the invention.

Referring to FIG. 4, a diagram is shown illustrating an example implementation of a generic 2×2 four-element single-polarization transceiver beam former circuit 112i in accordance with an example embodiment of the invention. In various embodiments, beam former circuits may implement a plurality of transceiver channels. Each transceiver channel generally comprises a transmit channel and a receive channel. Each of the transmit channels generally includes a power amplifier circuit embodying a sub-micron CMOS cascode power amplifier in accordance with an embodiment of the invention. In an example, the 2×2 four-element single-polarization transceiver beam former circuit 112i may implement four transceiver channels 306a-306d. The four transceiver channels (or circuits) 306a-306d may be coupled to respective antenna elements in a group of adjacent antenna elements by corresponding bidirectional radio-frequency signals (e.g., RF1-RF4). The transceiver channels and antenna elements generally form a two-dimensional antenna network.

In an example, the circuit 308 may be implemented as a 1-4 combiner/splitter network. In an example, the circuit 308 may comprise a number of combiner/splitters. In an example, the combiner/splitters may be implemented as Wilkinson combiner/splitters. In various embodiments, the combiner/splitters may be coupled together to form a network that couples the circuits 306a-306d to a common RF input/output port RFC of the beam former circuit 112i. In the transmit mode, the circuit 308 is generally operational to distribute the power in a signal at the common RF input/output port RFC among the circuits 306a-306d. In the receive mode, the circuit 308 may be operational to combine the power received in signals from the circuits 306a-306d into a signal presented at the common RF input/output port RFC. The circuits 306a-306d and 308 are generally configured to provide a substantially equivalent path length between the common RF input/output port RFC and each of the circuits 306a-306d. The topology of the beam former circuit 112i may be scaled to provide other numbers of transceiver channels to meet the design criteria of a particular implementation.

In embodiments implementing dual-polarization phased array antenna panel, a 2×2 four-element dual-polarization transceiver beam former circuit may implement similarly to the transceiver beam former circuit 112i, except with two instances of the four transceiver channels 306a-306d and network 308: a first instance configured for the horizontal transceiver channels; and a second instance configured for the vertical channels.

Figure 5:
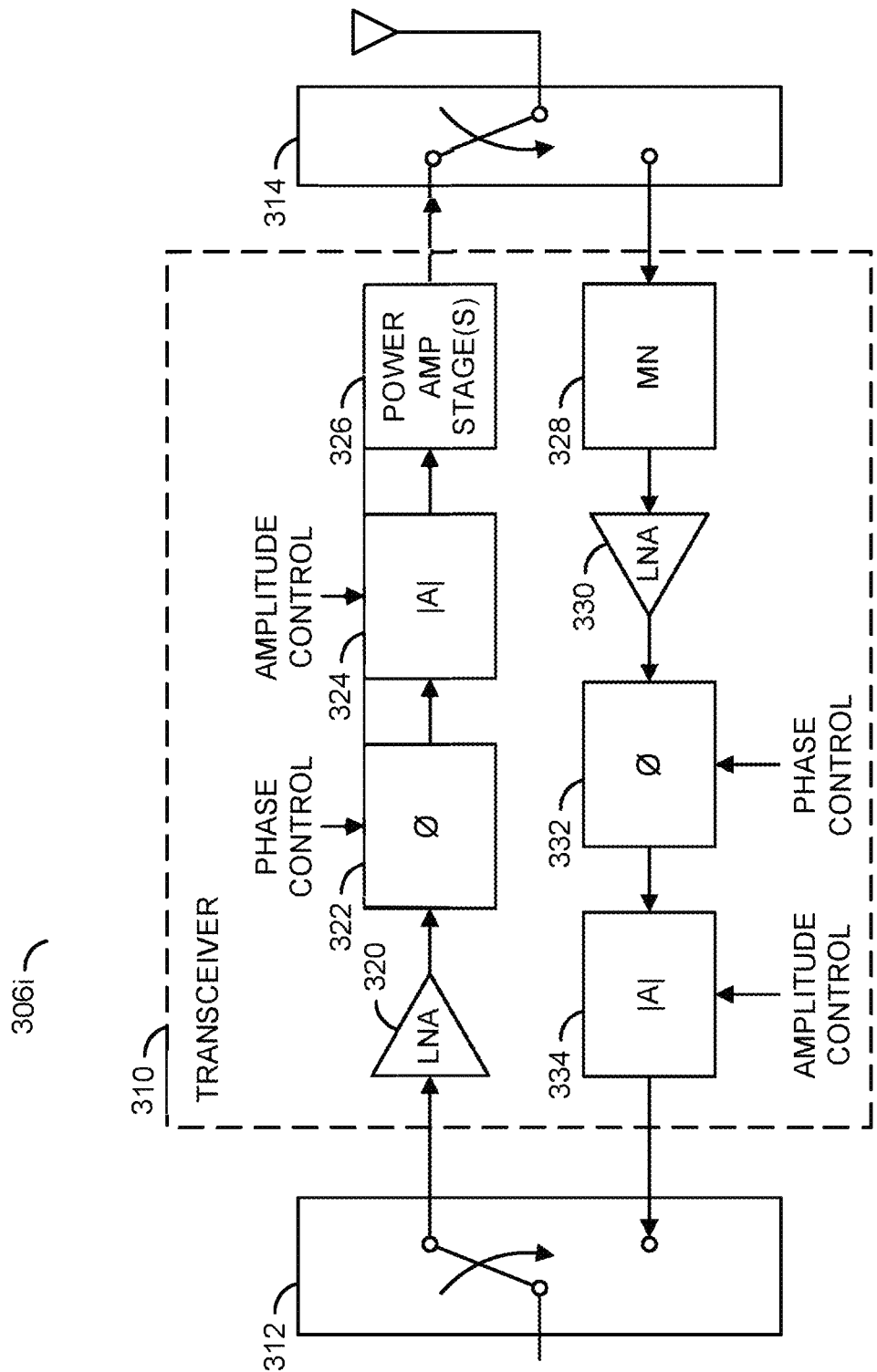
FIG. 5 is a diagram illustrating an example implementation of a transceiver channel with an output amplifier in accordance with an example embodiment of the invention.

Referring to FIG. 5, a block diagram of a transceiver circuit 306i is shown illustrating an example radio frequency (RF) amplifier application in accordance with an embodiment of the invention. In an example, the transceiver circuit 306i may be representative of the single-polarization beam former transceiver circuits (or channels) 306a-306d of FIG. 4. In another example, the transceiver circuit 306i may be representative of either horizontal or vertical beam former transceiver circuits (or channels) of a dual-polarization beam former circuit (or chip). In an example embodiment, the circuit 306i may comprise a block (or circuit) 310, a block (or circuit) 312, and a block (or circuit) 314. In an example embodiment, the circuit 310 may implement a transceiver circuit. The blocks 312 and 314 may implement transmit-receive (T/R) switches. A transceiver circuit is generally capable of both transmitting and receiving signals of a communication channel. In various embodiments, the circuit 310 may be capable of transmitting and receiving radio frequency (RF), microwave, and/or millimeter-wave signals.

In various embodiments, the circuit 310 may be representative of transceiver circuits utilized in applications including, but not limited to cellular base stations (e.g., 2G, 3G, 4G, 5G, etc.), wireless communication systems, wireless local area networks (WLANs), wireless backhaul channels, broadband repeaters, community antenna television (CATV) networks, macro cells, micro cells, pico cells, femto cells, mobile devices (MDs), and/or portable handheld devices (UEs). In some embodiments, the circuit 310 may be representative of a radar application including, but not limited to target detection, ranging, and/or through-wall imaging. In an example, the transceiver circuit 310 generally comprises both a transmitter chain and a receiver chain. Both the transmitter chain and the receiver chain may comprise radio frequency (RF) 5 amplifiers.

In an example, the transmitter chain may include an input amplifier 320, a variable (programmable) phase shifter 322, a variable (programmable) attenuator 324, and one or more output amplifier stages 326. In an example, the input amplifier 320 may be implemented as a low noise amplifier (LNA). The output amplifier stages 326 may include drivers, pre-amplifiers, and/or power amplifiers. In various embodiments, the power amplifiers generally include a power amplifier circuit utilizing a sub-micron CMOS cascode power amplifier in accordance with an embodiment of the invention. In an example, the receiver chain may include a matching network (MN) circuit 328, a low noise amplifier (LNA) 330, a variable (programmable) phase shifter 332, and a variable (programmable) attenuator 334. In an example, an input of the transmitter chain and an output of the receiver chain may be coupled to a transmission line or an RF transceiver system by the RF switch 312. In an example, an output of the transmitter chain and an input of the receiver chain may be coupled to a transmission line or an antenna by the RF switch 314. In various embodiments, the variable phase shifter 322, the variable attenuator 324, the variable phase shifter 332, and the variable attenuator 334 may be implemented using conventional techniques.

Figure 6:
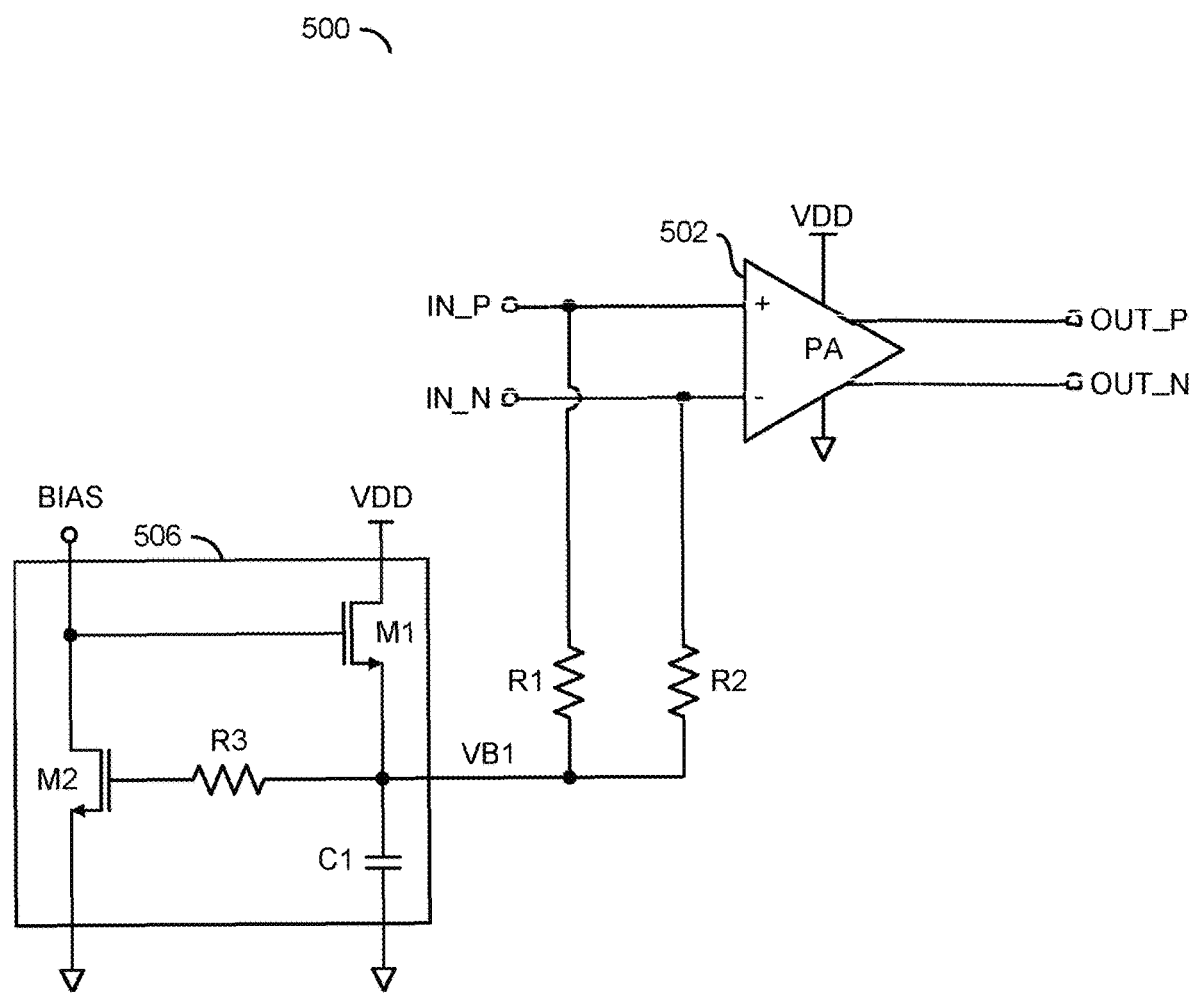
FIG. 6 is a diagram illustrating an example implementation of a differential RF amplifier in accordance with a single-ended embodiment.

Referring to FIG. 6, a diagram of a circuit 500 is shown illustrating an example implementation of a differential amplifier including a high-power cascode RF power amplifier implemented in sub-micron CMOS technology in accordance with an example embodiment of the invention. In various embodiments, the circuit 500 may be used to implement various amplifiers in millimeter-wave, microwave, and/or beam former chipsets. In an example, the circuit 500 may comprise a block (or circuit) 502 and a block (or circuit) 506. In an example, the block 502 may implement a differential power amplifier (PA). In an example, the block 506 may implement a bias circuit. In an example, the PA 502 may implement a single stage PA. In an example, the circuit 500 can be implemented in the power amplifier stages 326 of the transceiver 310 shown in FIG. 5.

In an example, the amplifier 502 may have a differential input, comprising a positive input (+) and a negative input (−), and a differential output comprising a positive output and a negative output. In an example, a signal IN_P may be presented to the positive input, a signal IN_N may be presented to the negative input, a signal OUT_P may be presented at the positive output, and a signal OUT_N may be presented at the negative output. The signals IN_P and IN_N may be components of a differential input signal. The signals OUT_P and OUT_N may be components of a differential output signal. The amplifier 502 may be configured to generate the signals OUT_P and OUT_N in response to the signals IN_P and IN_N. In an example, the signals IN_P and IN_N may be components of a differential input signal being outputted by the variable attenuator 324 shown in FIG. 5. In an example, the signals OUT_P and OUT_N may be components of a differential output signal being transmitted from the power amplifier stages 326 to the block or switch 314 shown in FIG. 5.

In an example, a resistor R1 and a resistor R2 may be used to bias the inputs of the amplifier 502. In an example, the resistor R1 may have a first terminal connected to the positive input of the amplifier 502 and a second terminal configured to receive a bias voltage (e.g., VB1) or a circuit ground potential. In an example, the resistor R2 may have a first terminal connected to the negative input of the amplifier 502 and a second terminal configured to receive the bias voltage (e.g., VB1) or the circuit ground potential. In an example, the resistors R1 and R2 may have values ranging from, for example, about 100 to about 2000 Ohms.

In an example, the circuit 506 may be configured to generate the bias voltage VB1 in response to a bias signal (e.g., BIAS). In an example, the circuit 506 may comprise a metal oxide semiconductor field effect transistor (MOSFET) M1, a MOSFET M2, a resistor R3, and a capacitor C1. A drain terminal of the transistor M1 may be tied to a power supply voltage (e.g., VDD). The signal BIAS may be presented to a node formed by connection of a gate terminal of the transistor M1 and a drain terminal of the transistor M2. A source terminal of the transistor M2 may be connected to the circuit ground potential. A gate terminal of the transistor M2 may be coupled by the resistor R3 to a source terminal of the transistor M1. The source terminal of the transistor M1 may be coupled by the capacitor C1 to the circuit ground potential. The bias voltage VB1 may be presented at a node formed by connection of the source terminal of the transistor M1, a terminal of the resistor R3, and a terminal of the capacitor C1. In an example, the circuit 506 may be implemented in NMOS technology. However, the transistors M1 and M2 may be implemented using other types of transistors (e.g., transistor types similar to the transistors used to implement the power amplifier 502). In an example, the transistors M1 and M2 may be implemented using heterojunction bipolar transistor (HBT) technology.

Figure 7:
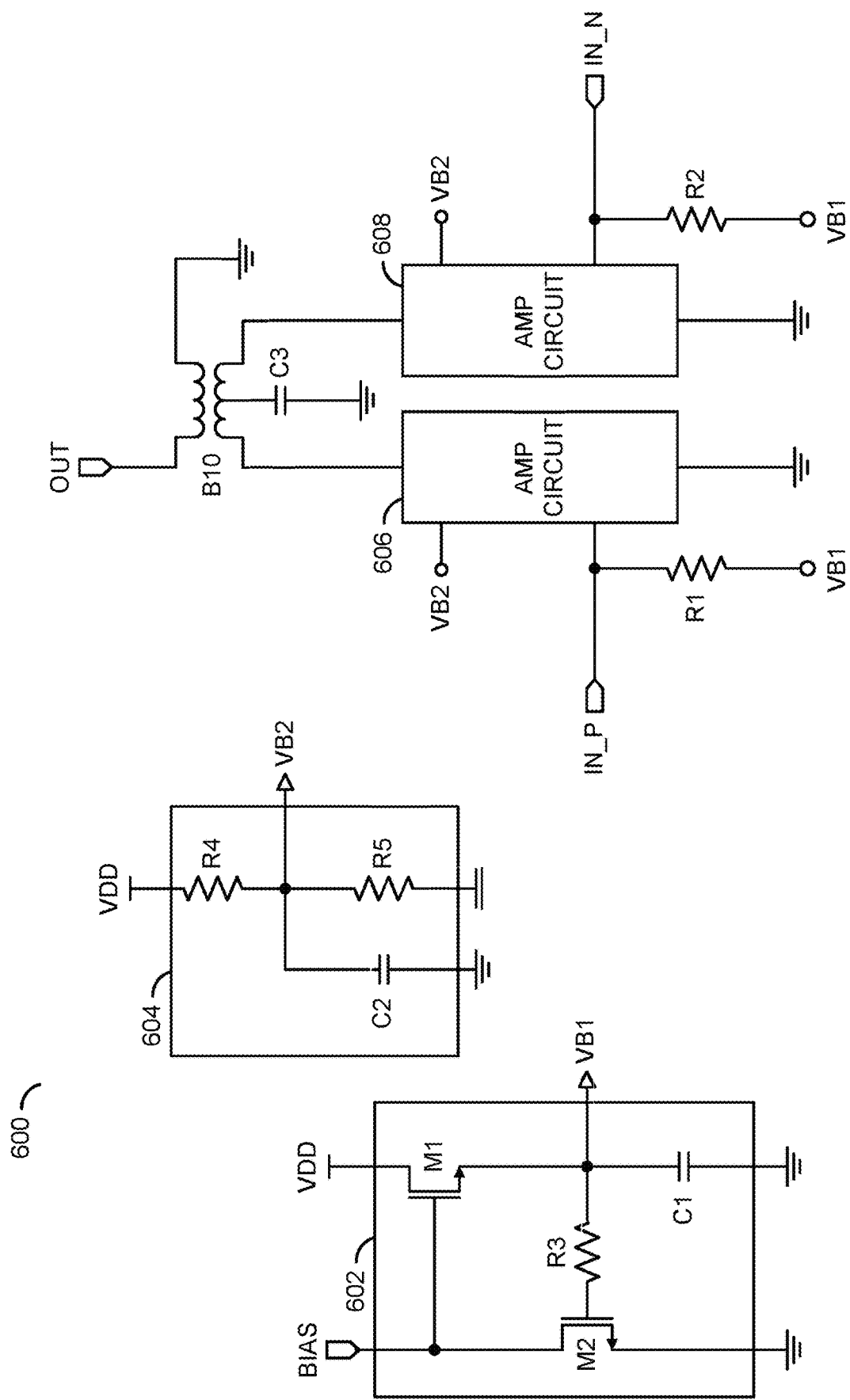
FIG. 7 is a diagram illustrating an example implementation of a single-ended RF amplifier in accordance with a single-ended embodiment.

Referring to FIG. 7, a diagram of a circuit 600 is shown illustrating another example implementation of a power amplifier in accordance with an example embodiment of the invention. In an example, the circuit 600 may be implemented comprising a single stage cascode power amplifier that includes a first cascode amplifier circuit 606 and a second cascode amplifier circuit 608, a first bias circuit 602, and a second bias circuit 604. The bias circuit 602 may be configured to generate a bias voltage (e.g., VB1) in response to an application of a bias signal BIAS and a power supply voltage (e.g., VDD). The bias circuit 604 may be configured to generate another bias voltage (e.g., VB2) in response to an application of the power supply voltage (e.g., VDD). In an example, the circuit 600 can be implemented in the power amplifier stages 326 of a transceiver 310 shown in FIG. 5. In an example, the bias circuit 602 can be the bias circuit 506 shown in FIG. 6, and the bias circuit 604 can be a part of the amplifier 502 shown in FIG. 6.

In an example, the single stage cascode power amplifier can include the first cascode amplifier circuit 606, the second cascode amplifier circuit 606, a resistor R1, a resistor R2, a capacitor C3, and a balun B10. In an example, the cascode amplifier circuits 606 and 608 may be implemented as sub-micron CMOS cascode power amplifier circuits. A first terminal of cascode amplifier circuit 606 may be connected to the circuit ground potential. A first terminal of the cascode amplifier circuit 608 may be connected to the circuit ground potential. The resistor R1 may have a first terminal connected to a second terminal of the cascode amplifier circuit 606 and a second terminal configured to receive the bias voltage VB1. The resistor R2 may have a first terminal connected to a second terminal of the cascode amplifier circuit 608 and a second terminal configured to receive the bias voltage VB1. The bias voltage VB2 may be presented to a third terminal of the cascode amplifier circuit 606 and a third terminal of the cascode amplifier circuit 608.

An input signal IN_P may be presented to the second terminal of the cascode amplifier circuit 606. An input signal of IN_N may be presented to the second terminal of the cascode amplifier circuit 608. The signals IN_P and IN_N may be components of a differential input signal. In an example, the resistor R1 and a resistor R2 may be used to bias the inputs of the cascode amplifier circuits 606 and 608, respectively. A first output signal of the amplifier may be presented at a fourth terminal of the cascode amplifier circuit 606. A second output signal of the amplifier may be presented at a fourth terminal of the cascode amplifier circuit 608. In an example, the outputs of the amplifier circuit may be connected to the balun B10 to achieve a single-ended output while the input is differential.

In an example, the circuit 602 may comprise a metal oxide semiconductor field effect transistor (MOSFET) M1, a MOSFET M2, a resistor R3, and a capacitor C1. A drain terminal of the transistor M1 may be tied to the power supply voltage VDD. The signal BIAS may be presented to a node formed by connection of a gate terminal of the transistor M1 and a drain terminal of the transistor M2. A source terminal of the transistor M2 may be connected to the circuit ground potential. A gate terminal of the transistor M2 may be coupled by the resistor R3 to a source terminal of the transistor M1. The source terminal of the transistor M1 may be coupled by the capacitor C1 to the circuit ground potential. The bias voltage VB1 may be presented at a node formed by connection of the source terminal of the transistor M1, a terminal of the resistor R3, and a terminal of the capacitor C1. However, the transistor M1 is generally implemented using similar types of transistors to the amplifier circuits 606 and 608. In an example, the transistor M2 may be implemented as a heterojunction bipolar transistor.

In an example, the circuit 604 may comprise a resistor R4, a resistor R5, and a capacitor C2. In various embodiments, the circuit 604 may provide bias (e.g., signal VB2) for the cascode node of the power amplifier cores 606 and 608. A first terminal of the resistor R4 may be tied to the power supply voltage VDD. A second terminal of the resistor R4 may be connected to a first terminal of the resistor R5 and a first terminal of the capacitor C2. A second terminal of the resistor R5 may be connected to the circuit ground potential. A second terminal of the capacitor C2 may be connected to the circuit ground potential. The signal VB2 may be presented at a node formed by the connection of the resistor R4, the resistor R5, and the capacitor C2.

Figure 8:
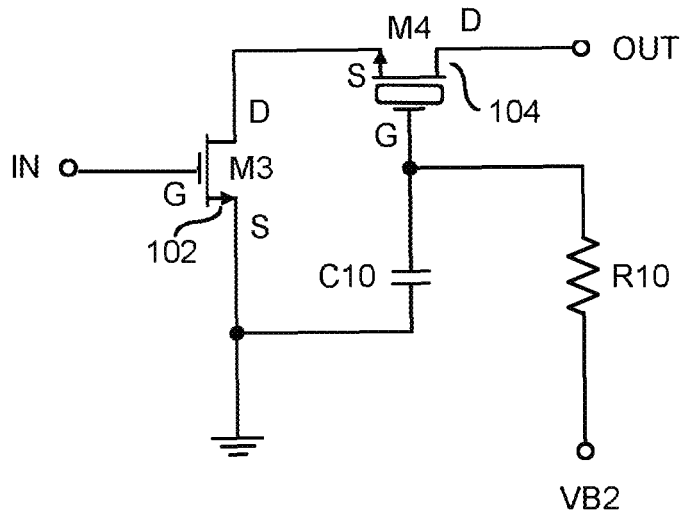
FIG. 8 is a diagram illustrating an example implementation of a sub-micron CMOS technology cascode amplifier in accordance with a single-ended embodiment.

Referring to FIG. 8, a schematic diagram of a circuit 100 is shown illustrating a sub-micron CMOS cascode transistor structure implementing a cascode radio frequency (RF) power amplifier core in accordance with an example embodiment of the invention. In an example, the cascode RF power amplifier core or circuit 100 can include a first body-contacted device 102 and a second body-contacted device 104. In another example, the devices 102 and 104 of the cascode RF power amplifier core 100 may comprise metal-oxide-semiconductor (MOS) devices implemented with silicon-on-insulator (SOI) technology. In an example, each one of the cascode amplifier circuits 606 and 608 can include a copy of the circuit 100.

In various embodiments, the device 102 and the device 104 can have different characteristics. For example, the device 102 can be implemented having a first gate oxide thickness and a first gate length. The device 104 can be implemented having a second gate oxide thickness and a second gate length. The second gate oxide thickness and the second gate length can be greater than the first gate oxide thickness and the first gate length, respectively. In an example, the device 102 may be implemented with a thin gate oxide and a gate length of, for example, approximately 40 nanometers (nm) to 56 nm, and the device 104 may be implemented with a thick gate oxide and a gate length of, for example, approximately 112 nm to 240 nm.

In an example, the gate oxide thickness and gate length of the devices 102 and 104 may be arbitrary and can be based on various design choices and fabrication constraints. In an example, a gain of the circuit 100 can be a function of the gate length and/or the gate oxide thickness of the device 102. For example, the gain of the circuit 100 can increase as the gate length and/or the gate oxide thickness of the device 102 decreases. In an example, a voltage swing of the circuit 100 can be a function of the gate length and/or the gate oxide thickness of the device 104. For example, the voltage swing of the circuit 100 can increase as the gate length and/or the gate oxide thickness of the device 104 increases. Thus, the gate length and gate thickness of the devices 102 and/or 104 can be dependent on a target performance of the circuit 100, such as a desired gain, a desired voltage swing, a desired distortion compensation, etc., of the circuit 100. In response to a target performance being defined, the functions of the gate oxide thickness and/or gate length of the devices 102 and/or 104 can be optimized to define the gate oxide thickness and/or the gate length of the devices 102 and/or 104. In an example, different combinations of gate length and different gate oxide thickness for the devices 102 and/or 104 can result in different performances of the circuit 100, and in some examples, different circuits can perform differently with devices having the same combination of gate length and gate oxide thickness.

The cascode RF amplifier structure or the circuit 100 can include the device 102 configured as a common source amplifier stage and the device 104 configured as a common gate amplifier stage. In various embodiments, the device 104 enables the cascode RF amplifier structure 100 to withstand relatively large voltage swings due to the device 104 having relatively larger gate length and thicker gate oxide, while the device 102 can provide relatively higher gain over a range of operating voltages of the circuit 100 due to the device 102 having relatively smaller gate length and thinner gate oxide.

In an example, an input signal IN may be presented to a gate terminal of the device 102. In an example, the input signal IN can be a biased version of IN_P (biased by VB1 through Resistor R1) as shown in FIG. 7 if the circuit 100 is a part of the cascode amplifier circuit 606. In another example, the input signal IN can be a biased version of IN_N (biased by VB1 through Resistor R2) as shown in FIG. 7 if the circuit 100 is a part of the cascode amplifier circuit 608. A source terminal of the device 102 may be connected to a circuit ground potential. A drain terminal of the device 102 may be connected to a source terminal of the device 104. A gate terminal of the device 104 may be connected to first terminal of a capacitor C10 and a first terminal of a resistor R10. A second terminal of the capacitor C10 may be connected to the circuit ground potential. A second terminal of the resistor R10 may receive the bias voltage VB2. A drain terminal of the device 104 may present an output signal. In various embodiments, the devices 102 and 104 may be fabricated using sub-micron complementary metal oxide semiconductor (CMOS) technology.

Figure 9:
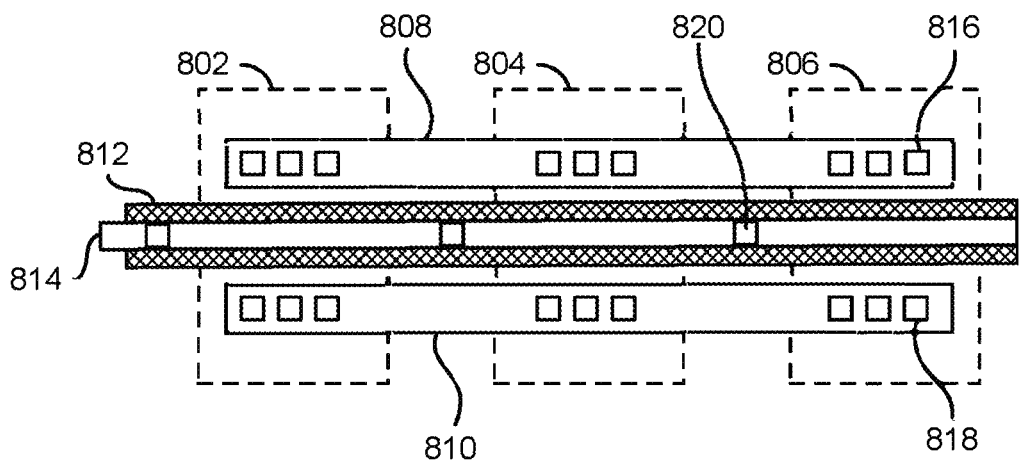
FIG. 9 is a diagram illustrating an example layout technique for overcoming a maximum unit gate width in sub-micron CMOS technology.

Referring to FIG. 9, a diagram of a plan view of a layout 800 is shown illustrating an example layout technique in accordance with an example embodiment of the invention. The layout 800 can be a layout for a transistor device, such as the device 102 or the device 104 shown in FIG. 8. In an example, three active regions (diffusions) 802, 804, and 806 may be disposed on a semiconductor substrate. A source metal strip 808 and a drain metal strip 810 may be formed over the three active regions 802, 804, and 806. The source metal strip 808 may be formed adjacent to a first side of a gate strip 812. The gate strip 812 can be composed of, or made of, for example, polysilicon material. The drain metal strip 810 may be formed adjacent to a second side of the gate polysilicon material 812. The source metal strip 808 may be connected to source regions of the active regions 802, 804, and 806 using vias 816. The drain metal strip 810 may be connected to drain regions of the active regions 802, 804, and 806 using vias 818.

In an example, an overall gate resistance of a device can increase as the gate width increases due to the high resistance materials (e.g., polysilicon) being used for the gate of the device. Thus, as the channel width of the devices is increased to allow more current drive, the overall gate resistance of the device also increases. The increased resistance can decrease the power gain and increase a nonlinearity of the device, and the increased nonlinearity can contribute to distortions such as AM-AM or AM-PM distortions. In an example, traditional approaches to address the increased resistance introduced by increased gate width may include adding gate fingers parallel to the existing gate. However, the parallel gate fingers may need to be connected to one another by using other routing layers adding complexity and subsequently reducing the usable frequency range of the device.

In an example, unit gate width of each of the devices 102 and 104 may be increased to increase the drive current capability of the power cell, thus increasing power and improving linearity. A metal strip 814 can be disposed on top of each unit gate strip 812 such that gate current is carried by both the polysilicon strip 812 (high resistance) and the metal strip 814 (low resistance) resulting in an effective overall lower gate resistance per unit width of the device. Compared to polysilicon only, the length of the strip (same as device unit gate width) can therefore be increased before the overall gate resistance negatively affects the RF performance. Since metal strip 814 and polysilicon strip 812 are separated by some insulator material, the metal strip 814 needs to be connected to the gate strip 812 at points outside the active regions 802, 804, and 806. Note that placing the vias inside the active region risks damaging the gate oxide underneath the polysilicon. In an example, the metal strip 814 can be made of relatively low resistance metal, such as copper. In the example shown in FIG. 9, a plurality of vias 820 can be placed in series with the metal strip 814 to tap the polysilicon material of the gate strip 812. In an example, the increased effective unit gate width of the devices 102 and 104 can be greater than a maximum recommended unit gate width in sub-micron complementary metal oxide semiconductor (CMOS) technology. By placing the vias 820 along the metal strip 814, the effective unit gate width of the devices 102 and/or 104 can be increased without adding gate fingers and without increasing an overall resistance of the devices 102 and/or 104 significantly. Further, for a relatively thin gate oxide device, such as the device 102, the vias 820 being tapped outside of the active region can avoid the risk of punching through the thin gate oxide to damage the device. Therefore, the placement of the metal strip 814 and the vias 820 can prevent significant increase in an overall resistance and improve linearity of a power amplifier (e.g., PA 502) where the devices 102 and 104 resides. The improved linearity can reduce phase difference and resistive loss across the gate strip 812, leading to compensations (e.g., increase cancellation) of distortions such as AM-AM and/or AM-PM distortions.

Figure 10A:
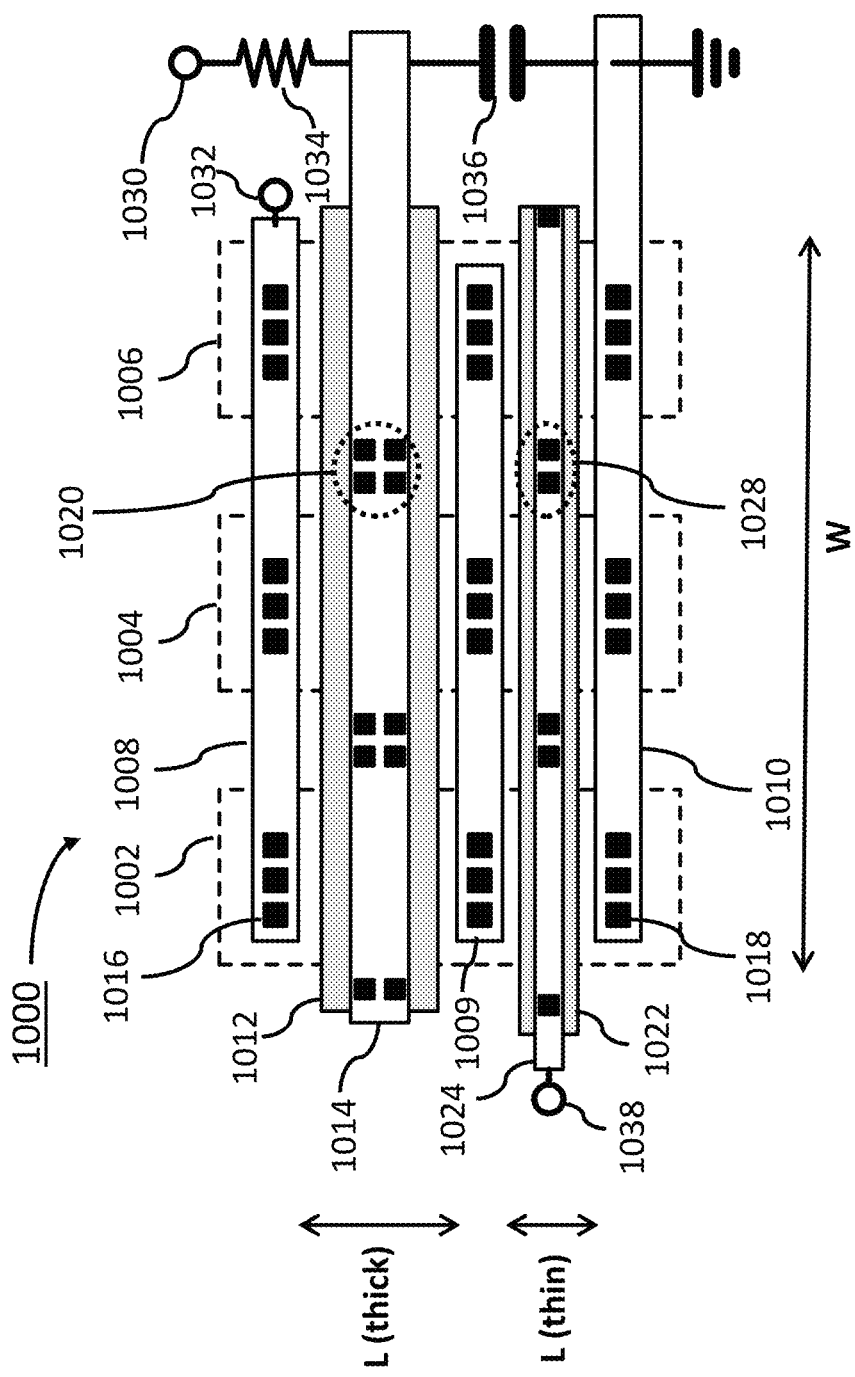
FIG. 10A is a diagram illustrating an example layout of a circuit in accordance with an embodiment.
Figure 10B:
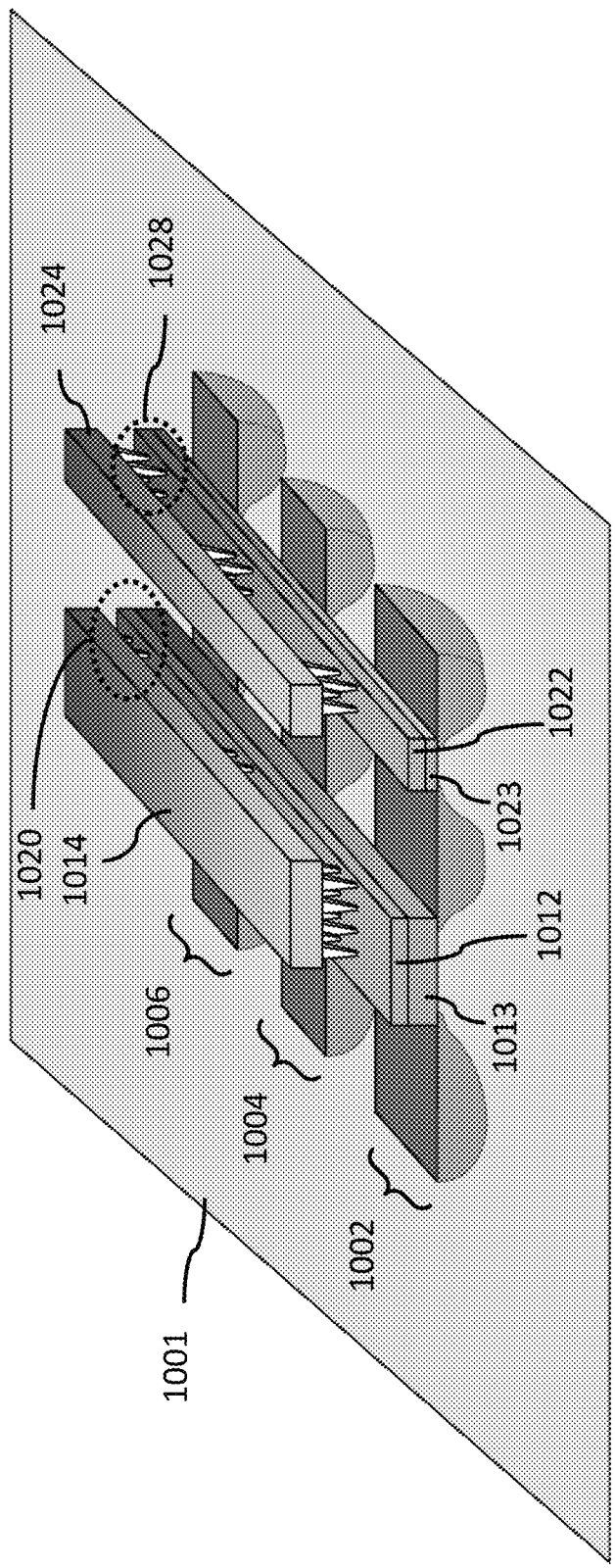
FIG. 10B is a diagram illustrating an example cross sectional view of a portion of the circuit shown in FIG. 10A.

Referring to FIG. 10A, an example layout of a circuit 1000 is shown in accordance with an example embodiment of the invention. An example cross sectional view of a portion of the circuit 1000 is shown in FIG. 10B. In an example, a plurality of active regions or diffusions, such as active regions 1002, 1004, and 1006 may be disposed on a semiconductor substrate 1001 (see FIG. 10B). A drain metal strip 1008, a metal strip 1009 for shared drain and source of the two devices, and a source metal strip 1010 may be formed over the active regions 1002, 1004, and 1006. The drain metal strip 1008 may be formed adjacent to a first side of a first gate strip 1012. The shared metal strip 1009 may be formed adjacent to a second side of the first gate strip 1012. The first gate strip 1012 can be made of, for example, polysilicon material. The source metal strip 1010 may be formed adjacent to a first side of a second gate strip 1022. The shared metal strip 1009 may be formed adjacent to a second side of the second gate strip 1022. The second gate strip 1022 can be made of, for example, polysilicon material. The drain metal strip 1008 may be connected to drain regions of the active regions 1002, 1004, and 1006 using vias 1016. The source metal strip 1010 may be connected to source regions of the active regions 802, 804, and 806 using vias 1018.

In an example, a first metal strip 1014 can be disposed on top of the first gate strip 1012, and a second metal strip 1024 can be disposed on top of the first gate strip 1022. In an example, the first metal strip 1014 and the second metal strip 1024 can be composed of, or made of relatively low resistance metal, such as copper. The first gate strip 1012 can have a first gate length (e.g., in the L direction) and a first gate oxide thickness 1013 (see FIG. 10B), and the second gate strip 1022 can have a second gate length and a second gate oxide thickness 1023 (see FIG. 10B). The first gate length can be greater than the second gate length, and the first gate oxide thickness can be greater than the second gate oxide thickness. In an example, the first gate strip 1012 can be a gate of the device 104 shown in FIG. 8, and the second gate strip 1022 can be a gate of the device 102 shown in FIG. 8. A bias voltage input 1030 can be the bias voltage input VB2 shown in FIG. 8. A voltage input 1038 can be the voltage input IN shown in FIG. 8. A voltage output 1032 can be the voltage output OUT shown in FIG. 8. A resistor 1034 can be the resistor R10 shown in FIG. 8, where the resistor 1034 can be connected between the bias voltage input 1030 and the first metal strip 1014. A capacitor 1036 can be the capacitor C10 shown in FIG. 8, where the capacitor 1036 can be connected between the first metal strip 1014 and the source metal strip 1010.

An effective unit gate width (e.g., in the W direction) of the device 104 may be increased by having the metal strip 1014 tapping the first gate strip 1012 at points outside the active regions 1002, 1004, and 1006. In the examples shown in FIG. 10A and FIG. 10B, a plurality of vias 1020 can be placed in series with the metal strip 1014 to tap the polysilicon material of the first gate strip 1012. The increased effective unit gate width of the device 104 can be greater than a maximum unit gate width in sub-micron complementary metal oxide semiconductor (CMOS) technology. By placing the vias 1020 along the metal strip 1014, the effective unit gate width of the 104 can be increased without significantly increasing the overall resistance of the device 102, and without the need to add gate fingers An effective unit gate width (e.g., in the W direction) of the device 102 may be increased by having the metal strip 1024 tapping the first gate strip 1022 at points outside the active regions 1002, 1004, and 1006. In the examples shown in FIG. 10A and FIG. 10B, a plurality of vias 1028 can be placed in series with the metal strip 1024 to tap the polysilicon material of the second gate strip 1022. The increased effective unit gate width of the device 102 can be greater than a maximum unit gate width in sub-micron complementary metal oxide semiconductor (CMOS) technology. By placing the vias 1028 along the metal strip 1024, the effective unit gate width of the device 102 can be increased without significantly increasing the overall resistance of the device 102, and without the need to add gate fingers.

Figure 11:
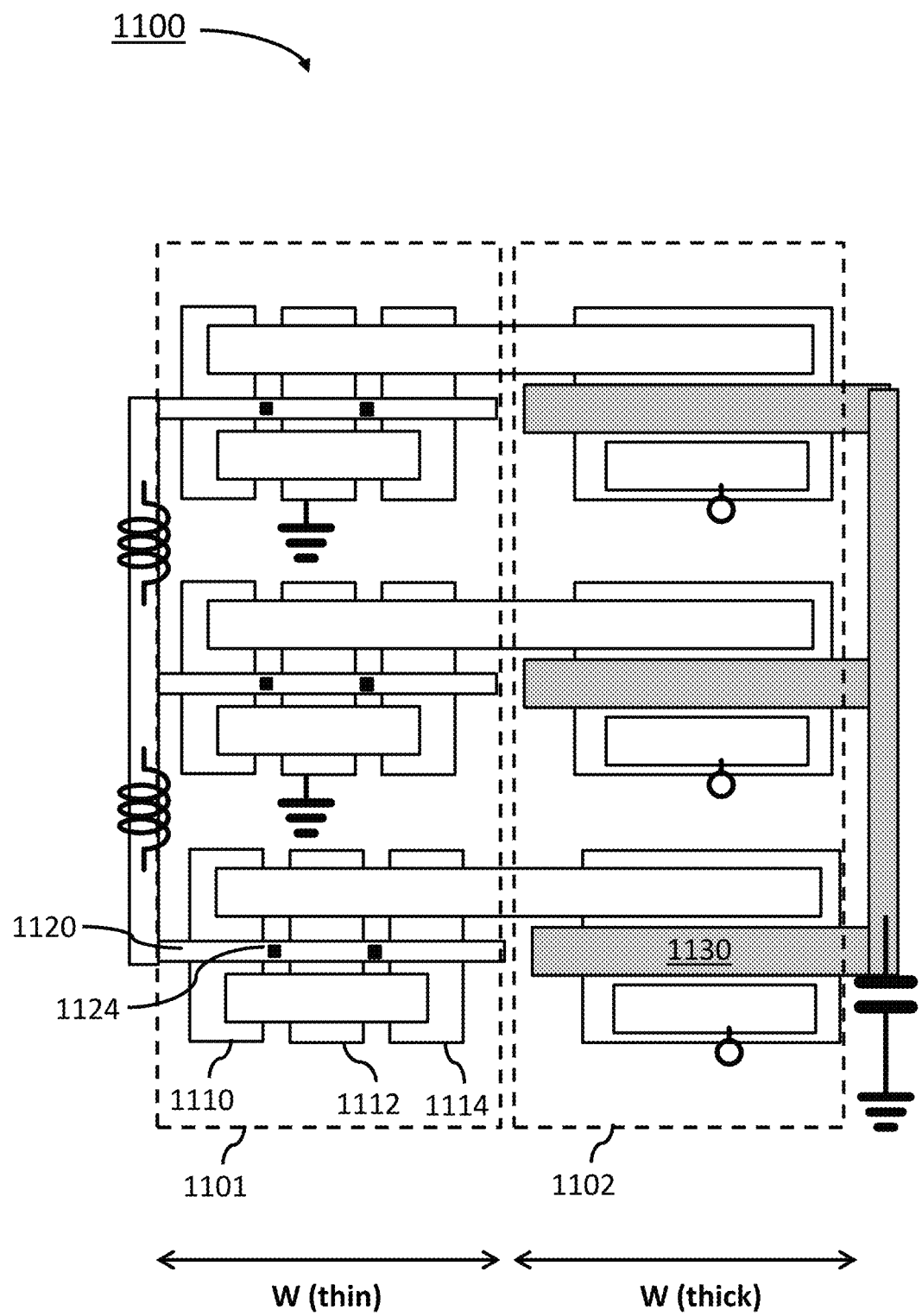
FIG. 11 is a diagram illustrating an example layout of another device in accordance with an example embodiment of the invention

Referring to FIG. 11, an example layout of a circuit 1100 is shown in accordance with an example embodiment of the invention. The circuit 1110 can include a portion 1101 and a portion 1102. The portion 1101 can include transistor devices having relatively short gate length and thin gate oxide. The portion 1102 can include transistor devices having relatively long gate length and thick gate oxide. Gate width of the 1101 portion and 1102 portion need not be identical and can be chosen for optimized RF performance. The devices in the portion 1101 can include metal strips on top of polysilicon gate materials, with vias tapping the polysilicon materials outside of active regions. For example, among the portion 1101, a polysilicon gate can span three active regions 1110, 1112, 1114, and a metal strip 1120 can be disposed on top of the polysilicon gate. One or more vias 1124 can be inserted in points outside of the three active regions 1110, 1112, 1114 to tap the metal strip 1120 with the polysilicon gate. The device in the portion 1102 may include polysilicon gate, such as polysilicon gate 1130, without tapping from metal strips and vias. Thus, the placement of metal strips on polysilicon gate and vias to increase gate width can be used for specific portions of a circuit, such as being implemented with other transistors devices that may not need an increased gate width.

Although embodiments of the invention have been described in the context of a RF application, the present invention is not limited to RF applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G, 5G) specifications or future specifications.

The terms "may", "can", and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated

What is claimed is:

1. An apparatus comprising:
a first transistor comprising a gate having a gate oxide with a first thickness and a first gate length, the first transistor being configured as a common source amplifier stage;
a second transistor comprising a gate having a gate oxide with a second thickness and a second gate length, the second transistor being configured as a common gate amplifier stage;
a metal strip disposed on top of a gate of the first transistor; and
a set of vias placed on the metal strip to tap the gate of the first transistor,
wherein:
the set of vias are placed at points along the metal strip and outside of active regions of the first transistor;
the first transistor and the second transistor are connected in a cascode configuration;
the second thickness is greater than the first thickness; and
the second gate length is greater than the first gate length.

2. The apparatus of claim 1, wherein the gate of the first transistor is composed of polysilicon.

3. The apparatus of claim 1, wherein the metal strip is a first metal strip and the set of via is a first set of vias, and second transistor comprises:
a second metal strip disposed on top of a gate of the second transistor; and
a second set of via placed on the second metal strip to tap the gate of the second transistor, the second set of via being placed at points along the second metal strip and outside of active regions of the second transistor.

4. The apparatus of claim 1, wherein an effective gate width of the first transistor exceeds a maximum unit gate width defined for the first transistor.

5. The apparatus of claim 1, wherein the metal strip is composed of copper.

6. The apparatus of claim 1, wherein the first transistor and the second transistor are part of a power amplifier.

7. An apparatus comprising:
a first bias circuit configured to output a first bias voltage;
a second bias circuit configured to output a second bias voltage;
a first amplifier circuit and a second amplifier circuit, each one of the first and second amplifier circuits comprises:
a first transistor comprising a gate having a gate oxide with a first thickness and a first gate length, the first transistor being configured as a common source amplifier stage; and
a second transistor comprising a gate having a gate oxide with a second thickness and a second gate length the second transistor being configured as a common gate amplifier stage;
a metal strip disposed on top of a gate of the first transistor; and
a set of vias placed on the metal strip to tap the gate of the first transistor, wherein:
the set of vias are placed at points along the metal strip and outside of active regions of the first transistor;
the first transistor and the second transistor are connected in a cascode configuration;
the second thickness is greater than the first thickness;
the second gate length is greater than the first gate length; and
each one of the first amplifier circuit and the second amplifier circuit is configured to:

receive an input signal biased by the first bias voltage;

receive the second bias voltage to drive a gate of the second transistor; and output an output signal that is an amplified version of the input signal.

8. The apparatus of claim 7, wherein the gate of the first transistor is composed of polysilicon.

9. The apparatus of claim 7, wherein the metal strip is a first metal strip and the set of via is a first set of via, and second transistor comprises:
a second metal strip disposed on top of a gate of the second transistor; and
a second set of via placed on the second metal strip to tap the gate of the second transistor, the second set of via being placed at points along the second metal strip and outside of active regions of the second transistor.

10. The apparatus of claim 7, wherein an effective gate width of the first transistor exceeds a maximum unit gate width defined for the first transistor.

11. The apparatus of claim 7, wherein the metal strip is composed of copper.

12. The apparatus of claim 7, wherein the input signal is a differential input signal, the output signal is a differential output signal, the input signal received by the first amplifier circuit is a first component of the differential input signal, and the input signal received by the second amplifier circuit is a second component of the differential input signal.

13. The apparatus of claim 12, wherein each one of the first amplifier circuit and the second amplifier circuit comprises a balun configured to convert the first component and the second component of the differential output signal into a single-ended output signal.

14. An apparatus comprising:
a phased antenna array;
a communication circuit connected to the phased antenna array, wherein a power amplifier stage of the communication circuit comprises:
a first bias circuit configured to output a first bias voltage;
a second bias circuit configured to output a second bias voltage;
a first amplifier circuit and a second amplifier circuit, each one of the first and second amplifier circuits comprises:
a first transistor comprising a gate having a gate oxide with a first thickness and a first gate length, the first transistor being configured as a common source amplifier stage;
a second transistor comprising a gate having a gate oxide with a second thickness and a second gate length the second transistor being configured as a common gate amplifier stage;
a metal strip disposed on top of a gate of the first transistor; and
a set of vias placed on the metal strip to tap the gate of the first transistor, wherein:
the set of vias are placed at points along the metal strip and outside of active regions of the first transistor;
the first transistor and the second transistor are connected in a cascode configuration,
the second thickness is greater than the first thickness;
the second gate length is greater than the first gate length:
each one of the first amplifier circuit and the second amplifier circuit is configured to:
receive an input signal biased by the first bias voltage;
receive the second bias voltage to drive a gate of the second transistor; and
output an output signal to the phased antenna array, wherein the output signal is an amplified version of the input signal.

15. The apparatus of claim 14, wherein the gate of the first transistor is composed of polysilicon.

16. The apparatus of claim 14, wherein the metal strip is a first metal strip and the set of via is a first set of via, and second transistor comprises:
a second metal strip disposed on top of a gate of the second transistor; and
a second set of via placed on the second metal strip to tap the gate of the second transistor, the second set of via being placed at points along the second metal strip and outside of active regions of the second transistor.

17. The apparatus of claim 14, wherein an effective gate width of the first transistor exceeds a maximum unit gate width defined for the first transistor.

* * * * *